United States Patent [19]
Emanuel

[11] Patent Number: 5,177,591
[45] Date of Patent: Jan. 5, 1993

[54] MULTI-LAYERED FLUID SOLUBLE ALIGNMENT BARS

[76] Inventor: Norbert T. Emanuel, 600 Jay St., Los Altos, Calif. 94022

[21] Appl. No.: 747,733

[22] Filed: Aug. 20, 1991

[51] Int. Cl.⁵ ..................... H01L 23/50; H01L 23/54
[52] U.S. Cl. .................................... 257/674; 257/666
[58] Field of Search .......................... 357/70; 437/220

[56] References Cited

U.S. PATENT DOCUMENTS

| | | | |
|---|---|---|---|
| 4,132,856 | 1/1979 | Hutchison et al. | 174/52 PE |
| 4,721,994 | 1/1988 | Mine et al. | 357/70 |
| 4,728,568 | 3/1988 | Sasada et al. | 428/349 |
| 4,754,317 | 6/1988 | Comstock et al. | 357/70 |
| 4,774,635 | 9/1988 | Greenberg et al. | 361/421 |
| 4,796,080 | 1/1990 | Phy | 357/70 |
| 4,801,561 | 1/1989 | Sankhagowit | 437/207 |
| 4,801,997 | 1/1989 | Ono et al. | 357/70 |
| 4,809,135 | 2/1989 | Yerman | 361/404 |
| 4,859,808 | 8/1989 | Jeter et al. | 174/68.5 |
| 4,899,207 | 2/1990 | Hallowell et al. | 357/70 |
| 4,987,475 | 1/1991 | Schlesinger et al. | 357/70 |

FOREIGN PATENT DOCUMENTS

| | | | |
|---|---|---|---|
| 0073547 | 4/1988 | Japan | 357/70 |
| 0076745 | 3/1989 | Japan | 357/70 |
| 0090558 | 3/1990 | Japan | 357/70 |
| 0097051 | 4/1990 | Japan | 357/70 |

Primary Examiner—Rolf Hille
Assistant Examiner—S. V. Clark
Attorney, Agent, or Firm—Schneck & McHugh

[57] ABSTRACT

A lead frame interconnection assembly and method of fabricating the assembly having multi-layered alignment bars. First and third layers of the alignment bars are strips of water soluble tape attached at opposite sides of the conductive fingers. The strips of tape are perpendicular to the conductive fingers and parallel to each other. The strips of tape sandwich a center layer that is made of a flowable, water soluble material. Preferably, the alignment bar acts as a dam bar to stop the flow of encapsulant material during the formation of a package. After the alignment bar has served the intended function, the bar may be dissolved without adversely affecting the structural integrity of the conductive fingers.

11 Claims, 4 Drawing Sheets

MULTI-LAYERED FLUID SOLUBLE ALIGNMENT BARS

DESCRIPTION

1. Technical Field

The present invention relates generally to lead frame assemblies and more particularly to lead frames for electrical communication between an electronic component and outside circuitry.

2. Background Art

Integrated circuit chips include contact pads along edges of the chips to allow electrical communication between circuitry within the chips and outside circuitry. Lead frames having a plurality of conductive fingers attach to the contact pads, either directly or by means of other conductors such as bond wires. A chip and the inner lead ends of the conductive fingers are typically encapsulated within ceramic or other dielectric material. Mechanical and electrical connection to outside circuitry is made at portions of the conductive fingers outside the encapsulation. For example, the outer lead ends may be soldered to a printed circuit board or the like.

Alignment bars are utilized to link adjacent conductive fingers during the fabrication and attachment steps. The most commonly known alignment bars are tie bars and dam bars. As described in U.S. Pat. No. 4,987,475 to Schlesinger et al., dam bars interconnect the conductive fingers in the plane of the lead frame and act as dams which limit the flow of material during transfer molding of the encapsulation. Schlesinger et al. describes one molding process as joining two mold halves together with the conductive fingers projecting through an opening between the halves, thereby leaving gaps between the conductive fingers and the mold halves through which the encapsulation material can extrude during molding. The dam bars prevent any significant flow of material. Tie bars connect the conductive fingers at the outer lead ends. During the molding process, the tie bars serve to maintain the proper alignment and spacing of the leads.

Dam bars and lead bars are typically made of the same material as the conductive fingers, e.g., copper. The lead frame is fabricated so that the bars and the conductive fingers are a unitary structure. The bars electrically short the conductive fingers together. Thus, the bars must be removed after the intended function has been fulfilled. After encapsulation of the integrated circuit chip, dam bars are removed by a punching operation. Tie bars are removed by cutting or shearing the bars from the conductive fingers.

The punching operation for removing bars presents a number of difficulties. With the ever-present goal of miniaturizing devices, integrated circuit chips are decreasing in size and increasing in the number of contact pads. Consequently, the density of conductive fingers is increasing. The punching operation of bars presents a manufacturing limit on density. Reliably punching each portion of a dam bar from between adjacent fingers becomes more difficult as density increases. The difficulties of removing tie bars include, as described in Schlesinger et al., leaving "pigtails" of metal and adding handling steps.

Other alignment bars are known. Schlesinger et al. teaches use of a web bar that is integral with the conductive fingers and that provides enhanced lead alignment when the conductive fingers are brazed to braze pads of fine line ceramic integrated circuit packages. After brazing, the web bar is mechanically removed using a punch trim tool. Tooling holes in the lead frame provide alignment for the trim tool, thereby increasing the accuracy and reliability of bar removal. U.S. Pat. No. 4,796,080 to Phy teaches use of intermediate bars located between tie bars and dam bars. The intermediate bars are made of a semiconductor material to guard against damage caused by electrostatic discharge during handling, but to provide sufficient electrical isolation of conductive fingers to allow testing prior to removal of the intermediate bars. The dam bars and tie bars are removed using conventional steps, whereafter the alignment and separation of fingers is maintained by the semiconductor intermediate bars. Removal of the intermediate bars is facilitated by scoring, or by localized stressing or weakening, of the conductive fingers. U.S. Pat. No. 4,801,561 to Sankhagowit teaches use of cross-links that function as dam bars to prevent ejection of encapsulant from the molding process between the conductive fingers. The cross-links are integral with the conductive fingers and are removed in a manner described above.

It is an object of the present invention to provide alignment bars for lead frames, wherein the alignment bars allow an increase in density of conductive fingers without requirement of tight tolerance tooling for removing the alignment bars. It is a further object to provide a method for fabricating a lead frame having such alignment bars.

SUMMARY OF THE INVENTION

The above objects have been met by a lead frame interconnection assembly and fabrication method in which alignment bars are multi-layered members that can be removed without special tooling and without the potential of affecting the structural integrity of conductive fingers on the lead frame. The alignment bars are dissolved after the bars have served their intended purposes.

The alignment bars preferably include first and second strips of fluid soluble tape sandwiching a center layer of fluid soluble material. The center layer is a flowable layer that enters the gaps between adjacent conductive fingers to prevent wicking of material during formation of an encapsulating package adjacent to the alignment bars. The alignment bars are then dissolved by application of a solvent, preferably water.

The first and second strips of fluid soluble tape are on opposite sides of the conductive fingers to trap the center layer of flowable material. In a preferred embodiment, the center layer is applied in liquid form by using silkscreening techniques. The three layers prevent capillary action from leading the encapsulation material along the gap between adjacent conductive fingers. The fluid soluble alignment bars are made of a dielectric material and may also be used to serve the function of tie bars or other lead frame bars known in the art.

An advantage of the present invention is that removal of the fluid soluble alignment bars does not require a punch tool which must be precisely aligned so as not to adversely affect the structural integrity of the conductive fingers. Rather, removal requires only the application of a solvent. The solvent is preferably water, but may be another liquid or even a gas. Thus, the removal process is both easier and more reliable. Another advantage is that the density of conductive fingers can be increased, since there is no requirement of extending a tool between adjacent conductive fingers to remove material.

BEST MODE FOR CARRYING OUT THE INVENTION

Figure 1:
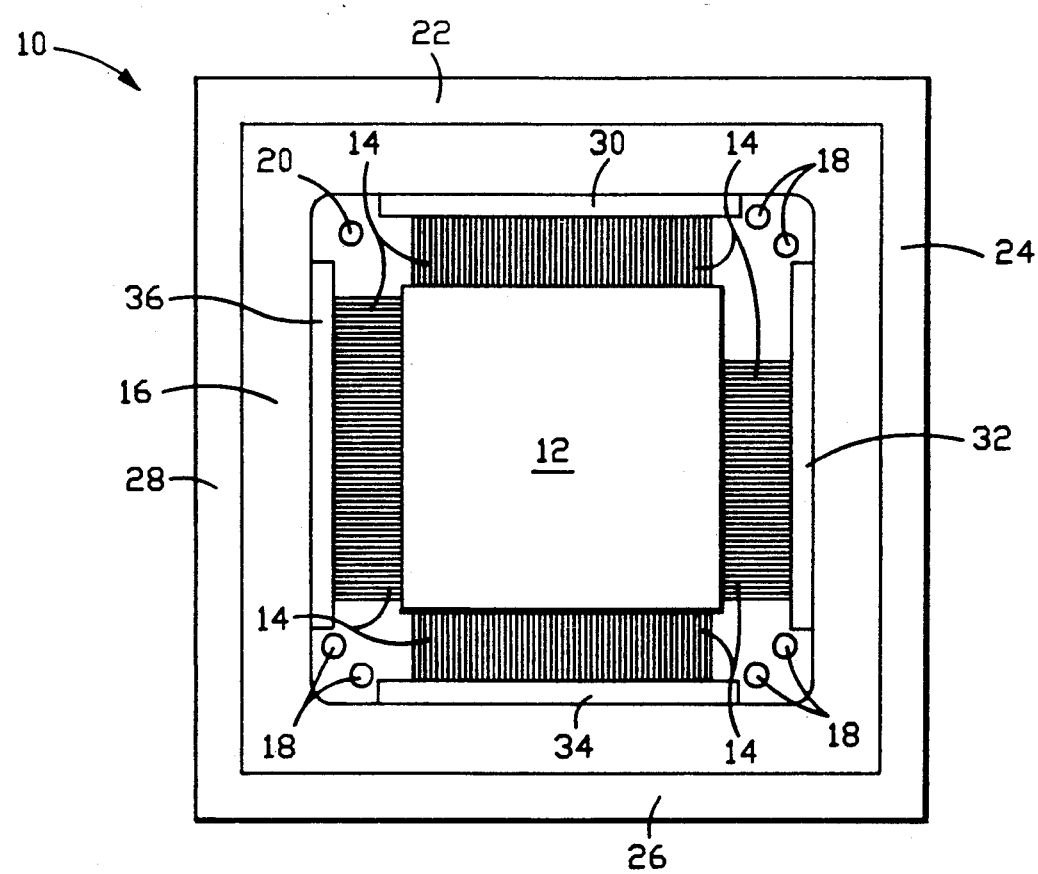
FIG. 1 is a top view of a lead frame having an encapsulated integrated circuit chip at a central region.

With reference to FIG. 1, a lead frame 10 is shown after two separate stages of encapsulation. A first package 12 houses an integrated circuit chip and inner lead ends of conductive fingers 14. A second package 16 is shown as being square and is used to encapsulate the outer lead ends of the conductive fingers 14. The present invention may be used in formation of either or both of the first and second packages.

A lead frame prior to bonding to an integrated circuit chip and prior to encapsulation by the first and second packages 12 and 16 has a unitary construction well known in the art. The lead frame is constructed from a thin layer of electrically conductive material. For example, a copper layer having a thickness of 0.003 inch may be used. A stamping process may be employed to remove material in a pattern to provide spaced apart conductive fingers 14. However, the preferred method is one of chemically etching the copper layer to form the desired pattern of conductive fingers. Standard photo-lithography techniques are used in etching material to provide the desired pattern. The chemical etching process is preferred because it allows a greater density of conductive fingers.

Alignment holes 18 and 20 are also etched into the copper layer. A pair of alignment holes 18 are etched at three corners of the first package 12, while a fourth corner has a single alignment hole 20. The alignment holes facilitate proper orientation of the lead frame 10 during assembly and testing. The single alignment hole typically is used to locate pin 1 of the first package 12.

Tie bars 22, 24, 26 and 28 are also formed from the copper layer during the etching process. The tie bars physically and electrically connect the conductive fingers at outer lead ends. While not shown, often the outer lead ends of the conductive fingers 14 extend slightly beyond the second package 16. The tie bars 22-28 must be removed prior to testing or operation of the integrated circuit chip within the first package 12. Serrations may be etched into the tie bar region for easy removal of the tie bars.

Dam bars 30, 32, 34 and 36 are mounted to the conductive fingers 14 by a method described below. The dam bars are positioned to prevent the wicking of encapsulating material during the transfer molding process that provides the second package 16. The dam bars enter the gaps between the conductive fingers, so that capillary action is limited. In the prior art dam bars are formed during the chemical etching process that provides the conductive fingers 14. However, removal of such dam bars injects a manufacturing limit to the density of the conductive fingers. The present invention removes this limitation.

Figure 2:
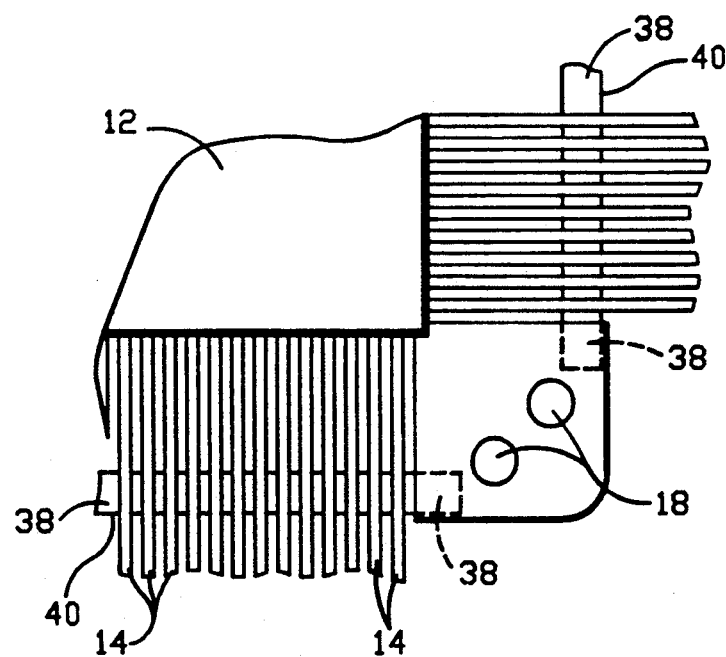
FIGS. 2-5 are top views of steps taken in providing the dam bars of FIG. 1.

A first step in providing the dam bars 30-36 is shown in FIG. 2. A first strip of water soluble tape 38 is applied to the lower surfaces of the conductive fingers 14 in a direction perpendicular to the longitudinal extension of the conductive fingers. In this connection, the term "water soluble" is the property of "rapid dispersion into water." The strip of water soluble tape is positioned so that an outside edge 40 will be directly adjacent to the second package 16 during the injection molding process for providing the second package. The width of the strip of water soluble tape 38 is 0.12 inch, but this is not critical. The strip of tape should be self adhesive to facilitate application. An acceptable tape having a solubility of 100 in water is sold by Tech Spray in Amarillo, Tex.

Figure 3:
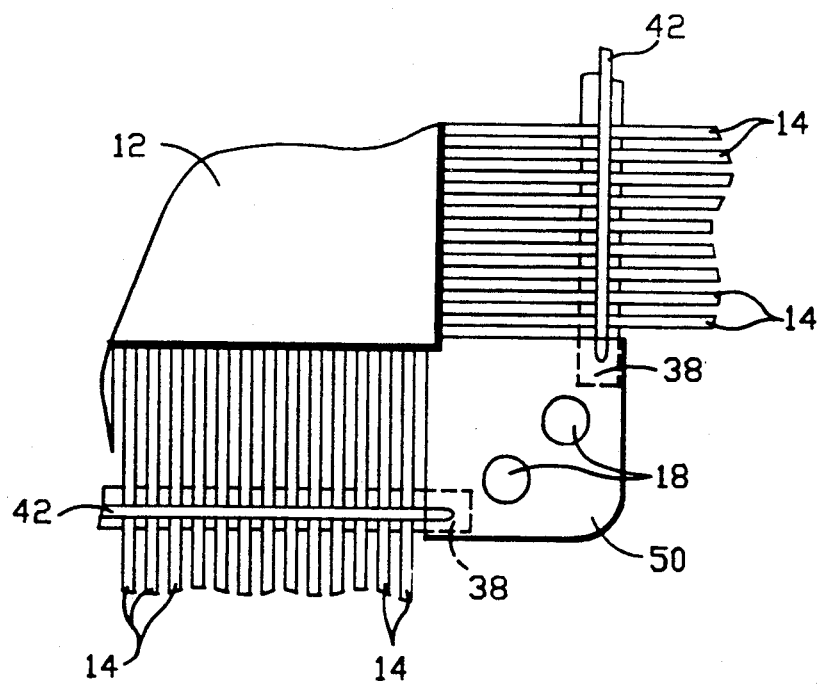

Referring now to FIG. 3, a bead of liquid water soluble material 42 is then applied to the portions of the conductive fingers 14 having the first strip 38 of water soluble tape. An acceptable liquid having a solubility in water of 40 is sold by Tech Spray. The width of the bead is preferably in the range of 0.03 inch to 0.04 inch. The bead should be centered along the first strip 38.

Figure 4:
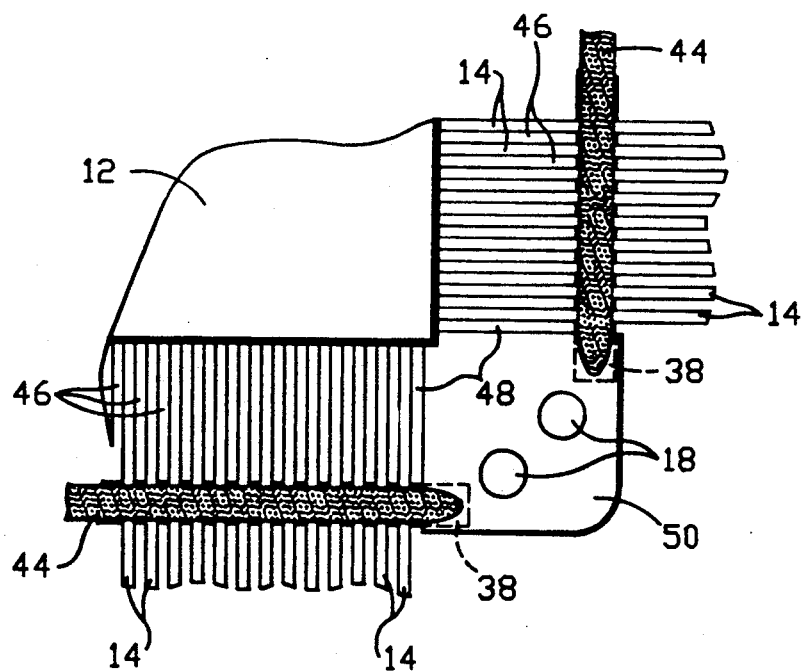

As shown in FIG. 4, the liquid bead is then spread to form a coating 44 of water soluble material. The coating 44 must enter the gaps 46 between the conductive fingers 14 and must enter the gap 48 between the end conductive finger and a copper region 50 having the alignment holes 18. However, a method that is preferred to the bead-apply and spread method for applying the coating 44 is one using standard silkscreening technology.

Figure 5:
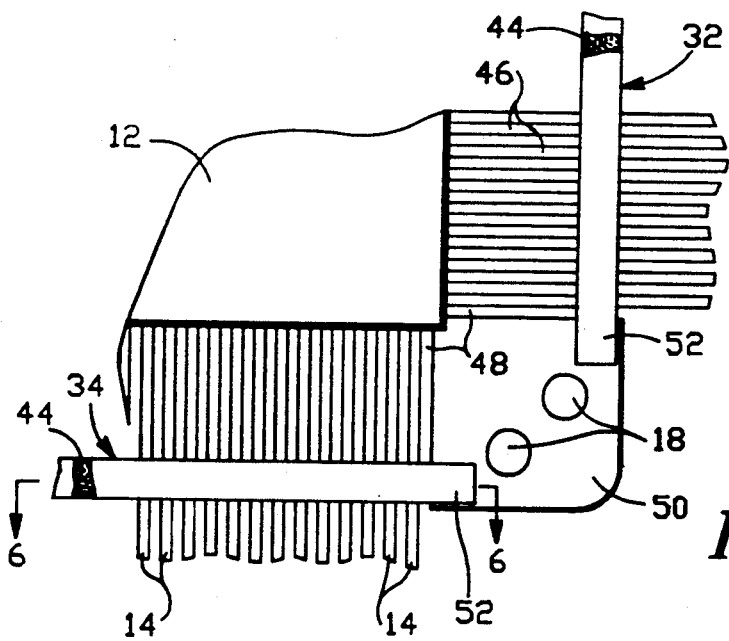
Figure 6A:
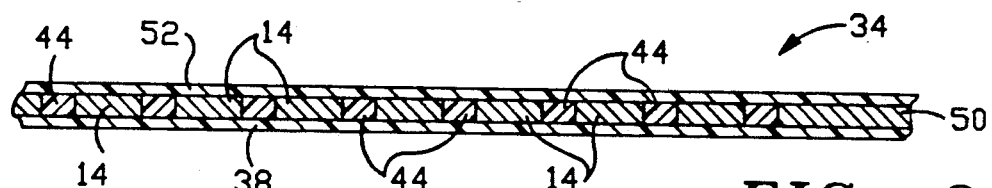
FIG. 6A is a side sectional view of the dam bar of FIG. 5 taken along lines 6—6.
Figure 6B:
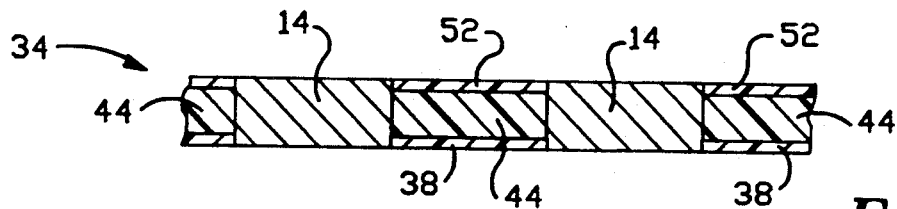
FIG. 6B is an enlarged view of a portion of the dam bar of FIG. 6A after application of a compression force.

A second strip of water soluble tape 52, shown in FIGS. 5 and 6A, is applied to the upper surface of the conductive fingers 14. The second strip is preferably identical to the first strip 38. The first and second strips 38 and 52 sandwich the fingers 14, the coating 44 and a portion of the copper region 50. The structure prevents the flow of encapsulant material during the transfer molding process that is to follow. During molding, the water soluble dam bar 34 is compressed, filling any voids and acting as a mold stop. The enlarged view of FIG. 6B illustrates the ideal, in which the compression causes all of the water soluble tape to be displaced into the spaces between the conductive fingers 14. In a transfer molding process, tape that remains on the upper and lower surfaces of the conductive fingers may cause a mold to remain open, causing resin bleed or "flash" over the surfaces of the mold and leadframe. The encapsulating material may bleed or flash in a gap as small as 0.0001 inch, thereafter causing problems in test contact and in a plating process.

Figure 7A:
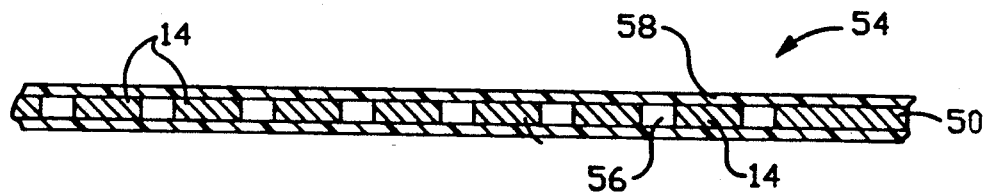
FIG. 7A is a side sectional view of a second embodiment of a dam bar.
Figure 7B:
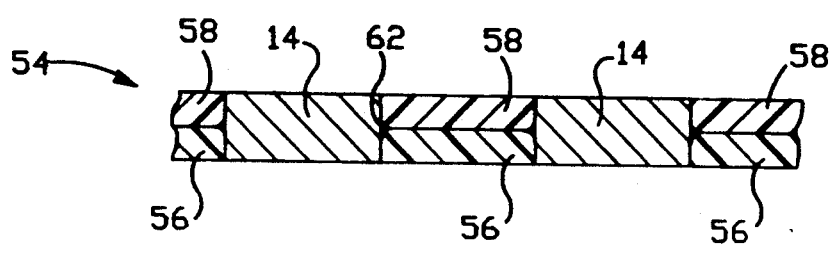
FIG. 7B is an enlarged view of a portion of the dam bar of FIG. 7A after application of a compression force.

The method described above for providing the water soluble dam bar 34 is a preferred method. Silk-screening the coating 44 ensures that after compression there are no gaps for the flow of encapsulant material. A second embodiment of a water soluble dam bar 54 is shown in FIG. 7A and 7B. Here, a first strip of water soluble tape 56 is applied to the lower surface of the conductive fingers 14 and a second strip 58 is applied to the upper surface. Thereafter, application of a compression force causes the first and second strips to merge toward the center of the dam bar 54 in gaps between the conductive fingers. The compression force is a direct result of the molding process. The contact reduces the likelihood of wicking of encapsulant material. Small openings 62 may exist, but because of the dissimilarity in materials and because of the properties of the water soluble tape, wicking of encapsulant material is not likely to reach an unacceptable level. The first and second strips 56 and 58 protect the upper and lower contact surfaces of the conductive fingers 14 from being coated with encapsulant material.

Figure 8:
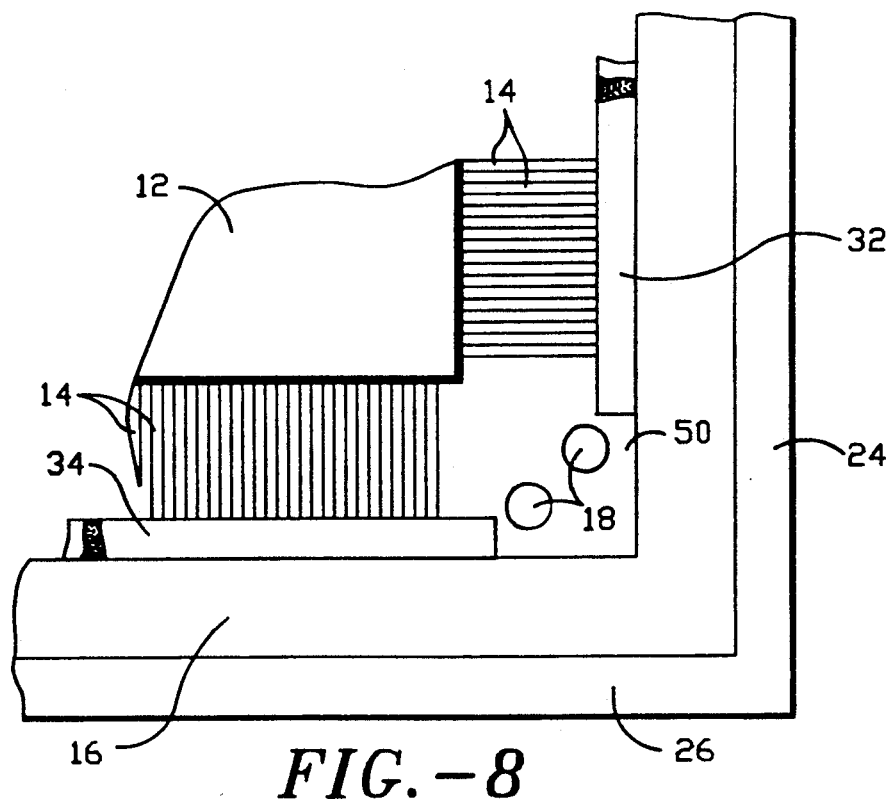
FIG. 8 is a top view of the lead frame of FIG. 5 following encapsulation of outer lead ends of conductive fingers.

Referring now to FIGS. 1 and 8, after air drying of the dam bars 30-36, conventional transfer molding forms the second package 16 at the outside edges of the dam bars. The encapsulant material is stopped by the dam bars. Techniques for forming a second package 16 other than transfer molding may be used. In any case, the water soluble dam bars function as stops.

Figure 9:
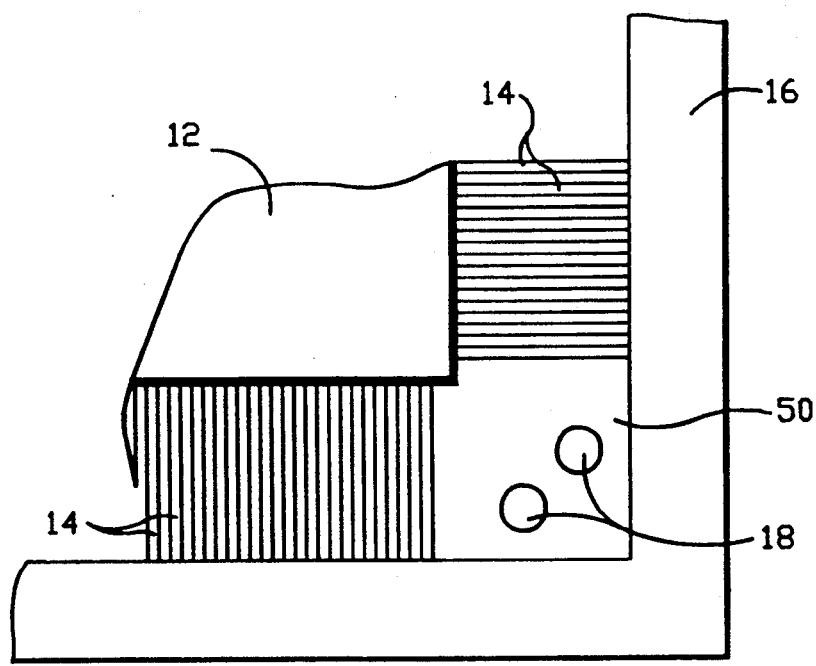
FIG. 9 is a top view of the lead frame of FIG. 8 following removal of the dam bars.

The lead frame 10 of FIG. 1 is then soaked in heated water for a period of time to dissolve the dam bars 30-36. A brushing action or a pressurized spray may be used to wash the water soluble material from the conductive fingers 14 after the soaking. The tie bars 22-28 may then be removed to provide the final structure shown in FIG. 9. The conductive fingers 14 are exposed at the region between the first package 12 and the second package 16 and have exposed outer ends, not shown, that are coplanar with the outside edge of the second package 16, so that electrical connection to the conductive fingers during testing and final mounting may be made at either of the two locations.

While the present invention has been illustrated and described for use in mold stopping during formation of the second package 16, other uses are possible. For example, the water soluble dam bars adapt well to provide mold stopping during formation of the first package 12. Moreover, in addition to use as dam bars, the water soluble bars may be used to replace other alignment bars. It may be possible to construct the strips of water soluble tape or the center coating to provide the alignment bars with the semiconductive properties described in U.S. Pat. No. 4,796,080 to Phy. The alignment bars described in Phy are intermediate bars that protect against damage due to electrostatic discharge conditions.

I claim:

1. A lead frame interconnection assembly comprising,
a pattern of spaced apart conductive fingers, said conductive fingers having inner lead ends for attachment to an electronic component and having outer lead ends, said conductive fingers having a first solubility in a preselected fluid, and
a fluid soluble alignment bar having a first layer attached in strip form to a first side of said conductive fingers in a direction generally perpendicular thereto, said alignment bar having a flowable second layer in contact with said first layer and extending between said conductive fingers, said first and second layers each having a solubility greater than said first solubility in said preselected fluid, whereby the structural integrity of said conductive fingers remains intact upon dissolving of said alignment bar.

2. The assembly of claim 1 wherein said alignment bar further includes a third layer attached in strip form to a second side of said conductive fingers opposite to said first side, said first and second layers being generally parallel.

3. The assembly of claim 2 wherein said first and third layers are strips of tape.

4. The assembly of claim 1 wherein said first and second layers are water soluble layers.

5. The assembly of claim 1 further comprising a package encapsulating region of said conductive fingers, said alignment bar fixed adjacent to said package to control formation of said package.

6. The assembly of claim 1 wherein said first and second layers are dielectric layers.

7. An assembly for connection of an electronic component to a circuit comprising,
a lead frame having a central attachment area and a pattern of spaced apart metallic fingers extending outwardly from said attachment area, and
alignment bar means for interattaching a plurality of said metallic fingers, said alignment bar means including parallel first and second strips of liquid soluble tape on opposed sides of said metallic fingers, said alignment bar means further having a center layer of liquid soluble material between said first and second strips and between said metallic fingers.

8. The assembly of claim 7 wherein said first and second strips of tape ar water soluble strips of tape.

9. The assembly of claim 7 wherein said pattern of metallic fingers includes a plurality of arrays of closely spaced metallic fingers extending from a plurality of sides of said attachment area, each array having one of said alignment bar means.

10. The assembly of claim 7 further comprising an encapsulation of a portion of said metallic fingers, said alignment bar means disposed adjacent to said encapsulation.

11. The assembly of claim 7 wherein said center layer is a liquid layer.

* * * * *